Jan. 15, 1957 R. B. ALBRIGHT ET AL 2,777,192
METHOD OF FORMING A PRINTED CIRCUIT
AND SOLDERING COMPONENTS THERETO
Filed Dec. 3, 1952

INVENTORS
ROBERT B. ALBRIGHT
HAROLD W. GOLDEN
BY
Brown, Denk & Synnestvedt
AGENTS United States Patent Office 2,777,192
Patented Jan. 15, 1957

2,777,192

METHOD OF FORMING A PRINTED CIRCUIT AND SOLDERING COMPONENTS THERETO

Robert B. Albright and Harold W. Golden, Philadelphia, Pa., assignors to Philco Corporation, Philadelphia, Pa., a corporation of Pennsylvania Application December 3, 1952, Serial No. 323,894

4 Claims. (Cl. 29—155.5)

The present invention relates to electric circuit constructions and, particularly, to electrical apparatus embodying so-called printed circuits. More specifically, the invention herein disclosed and claimed has to do with improvements in the production of printed circuits of the general variety described in our co-pending application, Serial No. 299,467, filed July 17, 1952.

In producing printed circuits of the kind above-mentioned, soldering points and conductor patterns are separately outlined with an insoluble acid-resistant material, usually asphaltum "resist," on laminated foil supported on a base or panel of insulating material. The foil comprises two superposed layers of conductive material which can be dissolved when treated with appropriate etching substances, one layer being of a material, such as aluminum, for which solder has no affinity, and the other layer being of a material, such as copper, which is capable of readily taking up, or being wetted by, solder. The utilization of laminated foil makes it possible to produce printed circuit panels provided with aluminum conductors having copper terminal portions to which leads of components can be readily soldered by dipping in a solder bath. Printed circuit panels which are constructed in the above-mentioned fashion, have the advantage that solder attaches itself only to the copper connecting points and to the adjoining portions of the component leads, thus eliminating waste of solder and, more importantly, obviating the likelihood of globules or droplets of solder forming between adjacent conductors to bring about possible short circuits. Generally, to insure satisfactory soldered connections, it is necessary to wash off the resist prior to the dip soldering operation so that flux applied to the soldering points can be effective.

In the commercial production of printed circuit panels, considerable time may elapse between the steps of removing the resist and of dip soldering, during which time the exposed copper surfaces may become oxidized, thus requiring an additional cleaning step prior to application of flux and the solder dipping operation. In any event, it will be apparent that removal of the resist alone increases the time required to produce the finished printed circuit panel and component assemblies.

It is the primary object of this invention to insure against oxidation of the copper portions of the printed circuit and, at the same time, to simplify the production of printed circuit assemblies.

Another and more specific object of the invention is to make is possible to effect a substantial saving in the operating time required to produce printed circuit assemblies.

The invention is further characterized by the novel manner in which the printed circuit panels are produced and the association of circuit components and conductor elements is accomplished.

In achievement of the above noted objects and advantageous features, the invention utilizes a resist which can be left on the panel to protect against oxidation of copper connecting portions in the circuit pattern and which further, during the soldering operation, acts as a flux to effect soldering of the component leads with said portions. In a narrower aspect, the invention employs a combined resist and flux material which, when applied to laminated foil to outline desired copper portions of the circuit pattern, is not affected by the etching treatment which removes unwanted copper portions, and which gives continued protection against oxidation of the copper portions in the circuit so that soldering can be done without being preceded by additional cleaning and flux applying steps.

The features of the invention, and the manner in which the above-recited objects and advantages are best achieved, will be fully understood from the following description of the embodiment shown in the accompanying drawing, in which.

It is pointed out that the various figures are diagrammatic and that the thicknesses of certain elements have been exaggerated for clarity of illustration.

Figure 1:
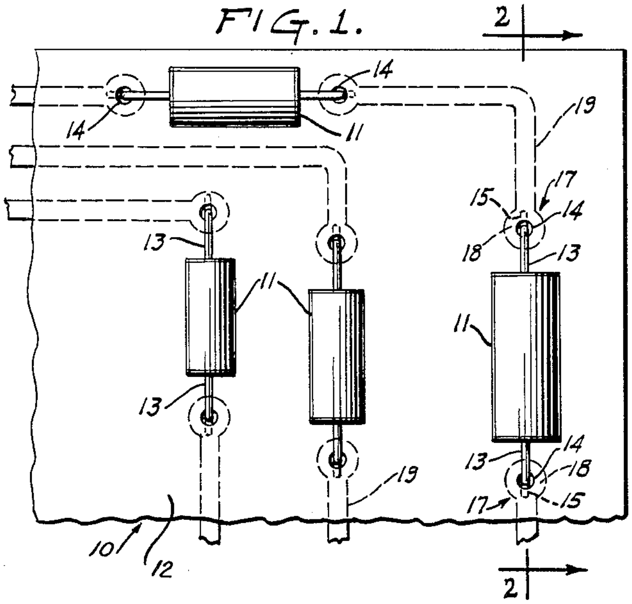
Figure 1 is a top plan view of a portion of a printed circuit panel constructed in accordance with the invention.
Figure 2:
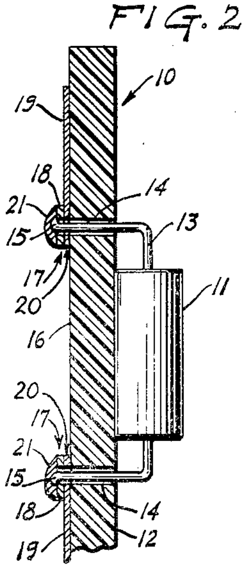
Figure 2 is a cross-sectional view taken substantially on line 2—2 of Figure 1.

With more particular reference to the drawing, the printed circuit construction shown in Figures 1 and 2 includes a base 10 which is conveniently made of phenolic plastic sheet material. In the illustrated embodiment, circuit components 11, such as condensers, resistors, transistors and like elements, are mounted on one side, preferably the top side 12, of the panel or base. The components are provided with wire leads 13 which pass through apertures 14 in said base. As best seen in Figure 2, the end portions 15 of said wire leads project a short distance beyond the other or bottom side 16 of the base and are adapted to overlie portions of foil material generally designated at 17. This foil material 17 comprises an inner layer 19 suitably bonded to the bottom side 16 of the base, and an outer layer 18 so united to the inner layer that both layers become permanently joined with the base to form a unitary laminated structure. The outer and inner layers of the laminated foil are made of conductive materials, the outer layer being a material, such as copper to which solder readily adheres, and the inner layer being a material, such as aluminum, to which solder does not adhere. A product which has been found suitable for the purpose of the invention, comprises a metallic foil consisting of a layer of copper and a layer of aluminum and a film of zinc between the copper and the aluminum, the zinc serving as a convenient medium to assure intimate bonding between the copper and the aluminum. The intermediate layer of zinc is not shown in the drawing since the zinc is not relevant to the inventive concept.

In the finished panel, as seen in Figures 1 and 2, the aluminum layer forms strip-like conductors 19 having terminal portions 20 disposed adjacent the apertures 14 in the base 16, that is to say at predetermined points where connections are made between the circuit components and said conductors. As is also seen in Figures 1 and 2, the copper layer appears only as restricted portions 18 in the finished product, being located at connection points and disposed over terminal portions of the aluminum strip conductors. Because of this novel arrangement, during the process of effecting solder connections between said component leads and conductors, solder 21 (see Figure 2) adheres only to the end portions 15 of leads 13 and to the restricted copper portions 18 at said connection points.

The above described finished printed circuit panel with or without the components 11, is described and claimed in our copending application aforesaid. The present invention concerns an improved method of producing such panels, and also resides in a novel product which results during the course of practicing said improved method.

The improved method or process and the manner in which the novel product is obtained in accordance with the invention, will be best understood by referring to Figures 3 to 8 inclusive.

Figure 3:
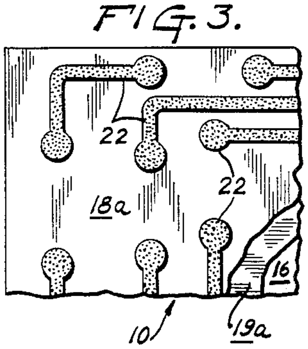
Figures 3 to 8, inclusive, are bottom plan views, on a reduced scale, illustrating successive steps in the process or method of producing a printed circuit panel as shown in Figures 1 and 2.

As illustrated in Figure 3, the panel or base 10 on which the improved method is practiced, has one side 16 completely clad with laminated foil including the outer layer of material, such as copper 18*a*, for which solder has an affinity, and the inner layer of material, such as aluminum 19*a*, for which solder has no affinity. As is also illustrated in Figure 3, the first step in practicing the invention involves the application of a suitable resist, such as asphaltum resist 22, on the outer (copper) layer to define thereon a complete pattern consisting of conductor portions and associated soldering point portions. The application of this pattern may be conveniently done by means of silk screening, offset printing or other suitable known processes. The conductor portions and soldering point portions of this pattern are associated according to a predetermined plan to provide the desired circuitry, each soldering point portion being located where a solder connection is to be made.

Figure 4:
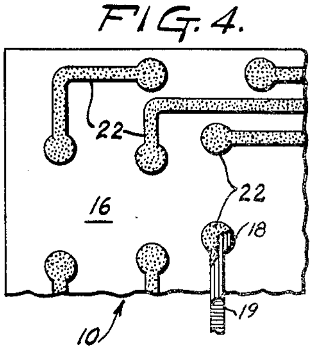

Following the application of asphaltum resist, the blank is treated to etch away or dissolve unwanted portions of laminated (copper and aluminum) foil, and to leave intact those portions of said foil which are protected by resist, as is represented in Figure 4. Etching away of both copper and aluminum can be accomplished by one treatment with ferric chloride. However, the dissolving action of ferric chloride on copper is comparatively slow and, in order to hasten the process, it is preferable to first treat the panel with nitric acid which rapidly dissolves copper, and then to treat the panel with ferric chloride which rapidly dissolves aluminum.

Figure 5:
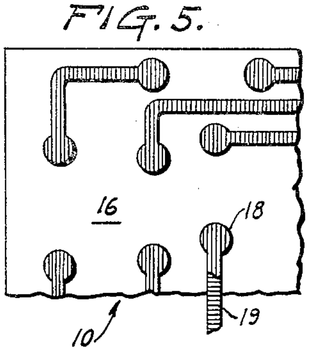

Following the removal of unwanted portions of laminated foil, the asphaltum resist is washed off with a suitable solvent such as turpentine. As a result, as seen in Figure 5, the panel is left with conductors and terminal portions, which conductors and portions are faced with the material (copper) of the outer layer of said foil.

Figure 6:
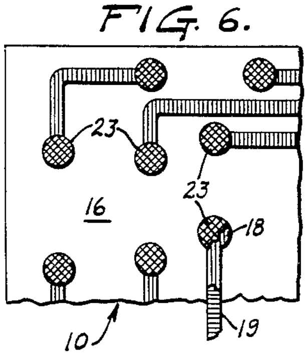

In particular accordance with the invention, and is as illustrated in Figure 6, the terminal portions adapted for soldering connection with component leads, are coated with a "resist-flux" 23, that is to say a material or composition which is capable of acting as a resist when the panel is treated with acid, such as nitric acid, to remove the material (copper) of the outer layer of the foil from the unprotected conductor portions, and which is also capable of acting as a flux when the component leads are soldered to the terminal portions. Resinous solutions, for example, rosin dissolved in alcohol in proportions of about two parts rosin to one part alcohol, provides a suitable "resist-flux" for the general purpose of this invention.

Another "resist-flux," and one which has been found well adapted for application by silk screening, is composed of the following ingredients in substantially the given proportions (by weight):

| | Percent |
|---|---|
| Rosin | 37.5 |
| Ester gum | 37.5 |
| Resinous chlorinated paraffin | 1.5 |
| Solvent | 23.5 |

the solvent consisting of the following ingredients in approximately the given proportions (by volume):

| | Percent |
|---|---|
| Ethylene glycol monobutyl ether | 40.00 |
| Diethylene glycol monobutyl ether | 40.00 |
| Ethyl lactate | 20.00 |

It has been found that resinous chlorinated paraffin containing approximately 70% chlorine, marketed under the trade name of "Chlorowax 70" by Diamond Alkali Company, Cleveland, Ohio, and that ethylene glycol monobutyl ether sold under the trade name "Butyl Cellosolve," and diethylene glycol monobutyl ether sold under the trade name "Butyl Carbitol," both manufactured by Carbide and Carbon Chemicals Corporation, New York city, New York, are satisfactory for the above given composition.

A non-corrosive flux, for example that sold under the trade name of "Saf-T-Flux No. 1 (For Printed Circuit)" and manufactured by Saf-T-Flux Co., Collegeville, Pennsylvania, may be added to said composition. In that event, the ingredients are mixed in substantially the following percentages (by weight):

| | Percent |
|---|---|
| Rosin | 30.00 |
| Ester gum | 30.00 |
| Resinous chlorination paraffin | 0.21 |
| Non-corrosive flux | 20.00 |
| Solvent | 19.79 |

the solvent having the same composition as above set forth.

Figure 7:
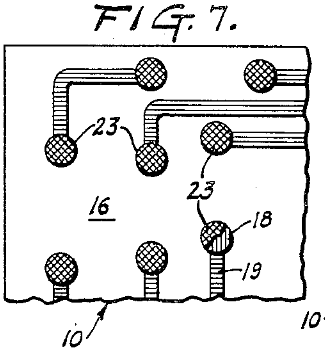

After coating the terminal portions, or connection points, with "resist-flux," the panel is treated with acid, such as nitric acid, which etches away the material (copper) of the outer layer of the laminated foil covering the conductor portions so that, as shown in Figure 7, there is provided a novel printed circuit panel which comprises conductors of material (aluminum) for which solder has no affinity, and terminals of material (copper) for which solder has an affinity, said terminals being covered with "resist-flux."

Figure 8:
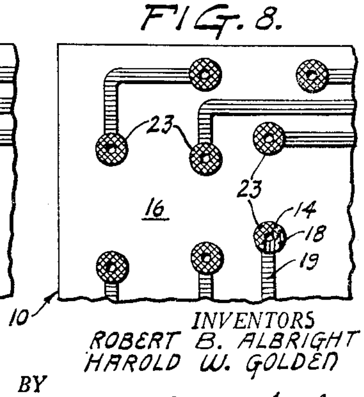

As represented in Figure 8, the preparation of this novel panel for mounting and soldering electronic components, involves perforation of said panel to provide the apertures 14 adapted to accommodate component leads in the manner hereinbefore described with reference to Figures 1 and 2. The perforation of the blank can be done in any suitable fashion, as by hand or machine drilling. However, the perforating of the blank is advantageously accomplished by means of a punching die designed to form, in one operation, an aperture within each area outlined by a copper-faced portion coated with "resist-flux."

In the commercial production of printed circuit panels according to the invention, it may be found desirable that in completed panels (either before or after the perforation forming step) be shipped to different locations for completing the panels, or that the panels be stored for subsequent use in continuing the process to complete the panel. In that event, the "resist-flux" which, in accordance with the invention is applied to the copper-faced portions to which solder connections are subsequently made, protects said copper portions against oxidation during shipment or storage for long periods of time.

In continuation of the process, circuit components 11 are mounted on the panel by inserting their leads into appropriate apertures from that side of the panel which is opposite to the side on which the printed circuit is formed. To effect connections between these leads and their associated conductor portionss, the panel is dipped in a molten solder bath, at least to a depth such that solder contacts and adheres to the terminal portions 18 of the conductor pattern and to the end portions 15 of the component leads 13. The heat of the hot solder causes the "resist-flux" to evaporate and to insure a strong solder connection between said terminal portions and said end portions of the component leads. The conductor portions 18 and exposed surface portions of the plastic base are not wetted by the solder, and no solder adheres to said conductor and surface portions when the panel is withdrawn from the solder bath.

From the foregoing description, it will be appreciated that the invention greatly simplifies the production of printed circuits and shortens the total operating time required to produce printed circuit assemblies. The process or method according to the invention is particularly advantageous because it protects connection points against oxidation prior to soldering of components and eliminates additional cleaning and flux applying steps.

We claim:

1. The method of forming a printed circuit and of soldering components thereto, which method comprises bonding a layer of aluminum to one side of a sheet of insulating material and a layer of copper to said aluminum layer to form a laminated structure, etching said layers to form a copper and aluminum circuit on said one side of said sheet, applying to and only upon spaced portions of the copper layer of said circuit a combined resist and flux composition and then acid-treating said one side of said sheet to dissolve the copper layer of said circuit while utilizing said composition as a resist agent to prevent dissolution of said coated copper portions to form an aluminum circuit on said one side of said sheet and coated contact areas on spaced portions of said aluminum circuit, thereafter perforating the laminated structure at said coated contact areas and inserting component leads through the perforations so that the components remain on the other side of said sheet and the leads are secured in contact with the coated contact areas, and finally immersing said one side of said sheet in a molten solder bath while utilizing said composition as a fluxing agent at said areas and leads.

2. The method of forming a printed circuit and of soldering components thereto, which method comprises forming a laminated structure by bonding to one side of a sheet of insulating material an etchable layer of conductive metal for which solder has no affinity and bonding on said layer a second etchable layer of conductive metal for which solder has an affinity, etching said layers to form a circuit of the first and second mentioned layers on said one side of said sheet, applying to and only upon spaced portions of the second mentioned layer of said circuit a combined resist and flux composition and then acid-treating said one side of said sheet to dissolve the second mentioned layer while utilizing said composition as a resist agent to prevent dissolution of said coated portions of said second mentioned layer to form a circuit of the first mentioned layer on said one side of said sheet and coated contact areas of the second mentioned layer on spaced portions of said circuit, thereafter perforating the laminated structure at the coated contact areas and inserting component leads through the perforations so that the components remain on the other side of said sheet and the leads are secured in contact with the coated contact areas, and finally immersing said one side of said sheet in a molten solder bath while utilizing said composition as a fluxing agent at said areas and leads.

3. The method of forming a printed circuit from a laminated structure having an insulating base with a layer of aluminum bonded to one side of said base and with a layer of copper bonded to said aluminum layer, and of soldering components to said circuit, which method comprises etching said layers to form an aluminum and copper circuit on said one side of said base, applying to and only upon spaced portions of the copper layer of said circuit a combined resist and flux composition and then acid-treating said one side of said sheet to dissolve the copper of said circuit while utilizing said composition as a resist agent to prevent dissolution of said coated copper portions to form an aluminum circuit on said one side of said sheet and coated contact areas on said aluminum circuit, thereafter perforating the laminated structure at the coated contact areas and inserting component leads through the perforations so that the components remain on the other side of said base and the leads are secured in contact with said coated contact areas, and finally immersing said one side of said base in a molten solder bath while utilizing said composition as a fluxing agent at said areas and leads.

4. The method of forming a printed circuit from a laminated structure having an insulating base with an etchable layer of conductive metal for which solder has no affinity bonded to one side of said base and with a second etchable layer of conductive metal for which solder has an affinity bonded to the first mentioned layer, and soldering components to said circuit, which method comprises etching said layers to form a circuit of the first and second mentioned layers on said one side of said base, applying to and only upon spaced portions of the second mentioned layer of said circuit a combined resist and flux composition and then acid-treating said one side of said sheet to dissolve the second mentioned layer of said circuit while utilizing said composition as a resist agent to prevent dissolution of said coated portions of said second mentioned layer to form a circuit of the first mentioned layer on said one side of said base and contact areas of the second mentioned layer on spaced portions of said circuit, thereafter perforating the laminated structure at the coated contact areas and inserting components through the perforations so that the components remain on the other side of the base and the leads are secured in contact with said coated contact areas, and finally immersing said one side of said base in a molten solder bath while utilizing said composition as a fluxing agent at said areas and leads.

References Cited in the file of this patent

UNITED STATES PATENTS

| | | |
|---|---|---|
| 762,840 | Osborn | June 14, 1904 |
| 1,726,100 | Da Costa | Aug. 27, 1929 |
| 1,804,024 | Nicolas et al. | May 5, 1931 |
| 2,244,009 | Hiensch | June 3, 1941 |
| 2,246,931 | Chiffey | June 24, 1941 |
| 2,270,166 | Hiensch | Jan. 13, 1942 |
| 2,418,265 | Korpiun | Apr. 1, 1947 |
| 2,441,960 | Eisler | May 25, 1948 |
| 2,445,431 | Hill | July 20, 1948 |
| 2,512,162 | Lips | June 20, 1950 |
| 2,513,365 | Rogoff | July 4, 1950 |
| 2,607,821 | Van Arsdell | Aug. 19, 1952 |
| 2,607,825 | Eisler | Aug. 19, 1952 |
| 2,613,244 | Del Camp | Oct. 7, 1952 |